United States Patent
Schmidt et al.

(10) Patent No.: US 11,535,798 B2
(45) Date of Patent: Dec. 27, 2022

(54) SWIR PCLED AND PEROVSKITE TYPE AND GARNET TYPE PHOSPHORS EMITTING IN THE 1000-1700 NM RANGE

(71) Applicant: LUMILEDS LLC, San Jose, CA (US)

(72) Inventors: Peter Josef Schmidt, Aachen (DE); Detlef Wiechert, Aachen (DE)

(73) Assignee: Lumileds LLC, San Jose, CA (US)

(*) Notice: Subject to any disclaimer, the term of this patent is extended or adjusted under 35 U.S.C. 154(b) by 226 days.

(21) Appl. No.: 17/035,337

(22) Filed: Sep. 28, 2020

(65) Prior Publication Data
US 2021/0098660 A1 Apr. 1, 2021

(30) Foreign Application Priority Data
Oct. 1, 2019 (EP) .................................... 19200773

(51) Int. Cl.
| | |
|---|---|
| *H01L 33/30* | (2010.01) |
| *H01L 33/50* | (2010.01) |
| *H01L 33/32* | (2010.01) |
| *C09K 11/77* | (2006.01) |
| *C01G 15/00* | (2006.01) |
| *C09K 11/08* | (2006.01) |
| *C09K 11/64* | (2006.01) |

(52) U.S. Cl.
CPC ........ *C09K 11/7708* (2013.01); *C01G 15/006* (2013.01); *C09K 11/0883* (2013.01); *C09K 11/641* (2013.01); *C09K 11/7701* (2013.01); *C09K 11/7703* (2013.01); *C09K 11/7734* (2013.01); *H01L 33/30* (2013.01); *H01L 33/305* (2013.01); *H01L 33/325* (2013.01); *H01L 33/504* (2013.01); *C01P 2002/54* (2013.01)

(58) Field of Classification Search
CPC .... H01L 33/305; H01L 33/325; H01L 33/504
See application file for complete search history.

(56) References Cited

U.S. PATENT DOCUMENTS

| | | | |
|---|---|---|---|
| 6,737,681 B2 * | 5/2004 | Koda | H01L 33/507 313/486 |
| 2003/0013593 A1 | 1/2003 | Beall et al. | |
| 2010/0320480 A1 * | 12/2010 | Rapoport | H01L 33/50 257/E33.061 |
| 2019/0113207 A1 * | 4/2019 | Palmer | G02B 5/223 |

FOREIGN PATENT DOCUMENTS

JP 2019-087711 A 6/2019

OTHER PUBLICATIONS

Suzuki Takenobu et al., "Optical properties of transparent Li2O—Ga2O3—SiO2 glass-ceramics embedding Ni-doped nanocrystals", Applied Physics Letters, AIP Publishing LLC, US, vol. 86, No. 13, Mar. 21, 2005, 3 pages.

(Continued)

Primary Examiner — Mark W Tornow

(57) ABSTRACT

A wavelength converting structure is disclosed, the wavelength converting structure including an SWIR phosphor material having emission wavelengths in the range of 1000 to 1700 nm, the SWIR phosphor material including at least one of a perovskite type phosphor doped with $Ni^{2+}$, a perovskite type phosphor doped with $Ni^{2+}$ and $Cr^{3+}$, and a garnet type phosphor doped with $Ni^{2+}$ and $Cr^{3+}$.

19 Claims, 20 Drawing Sheets

(56) References Cited

OTHER PUBLICATIONS

Zhigang Gao et al., "Selective doping of Ni2+ in highly transparent glass-ceramics containing nano-spinels ZnGa2O4 and Zn1+x Ga2-2x Ge x O4 for broadband near-infrared fiber amplifiers", Scientific Reports, vo. 7, No. 1, May 11, 2017, 8 pages.
Extended European Search Report corresponding to EP 19200773.0, dated Apr. 21, 2020, 8 pages.

* cited by examiner

SWIR PCLED AND PEROVSKITE TYPE AND GARNET TYPE PHOSPHORS EMITTING IN THE 1000-1700 NM RANGE

CROSS-REFERENCE TO RELATED APPLICATIONS

This application claims benefit of priority to European Patent Application No. 19200773.0 filed Oct. 1, 2019.

BACKGROUND

Semiconductor light emitting diodes and laser diodes (collectively referred to herein as "LEDs") are among the most efficient light sources currently available. The emission spectrum of an LED typically exhibits a single narrow peak at a wavelength determined by the structure of the device and by the composition of the semiconductor materials from which it is constructed. By suitable choice of device structure and material system, LEDs may be designed to operate at ultraviolet, visible, or infrared wavelengths.

LEDs may be combined with one or more wavelength converting materials (generally referred to herein as "phosphors") that absorb light emitted by the LED and in response emit light of a longer wavelength. For such phosphor-converted LEDs ("pcLEDs"), the fraction of the light emitted by the LED that is absorbed by the phosphors depends on the amount of phosphor material in the optical path of the light emitted by the LED, for example on the concentration of phosphor material in a phosphor layer disposed on or around the LED and the thickness of the layer.

Phosphor-converted LEDs may be designed so that all of the light emitted by the LED is absorbed by one or more phosphors, in which case the emission from the pcLED is entirely from the phosphors. In such cases the phosphor may be selected, for example, to emit light in a narrow spectral region that is not efficiently generated directly by an LED. Alternatively, pcLEDs may be designed so that only a portion of the light emitted by the LED is absorbed by the phosphors, in which case the emission from the pcLED is a mixture of light emitted by the LED and light emitted by the phosphors. By suitable choice of LED, phosphors, and phosphor composition, such a pcLED may be designed to emit, for example, white light having a desired color temperature and desired color-rendering properties

DETAILED DESCRIPTION

Figure 1:
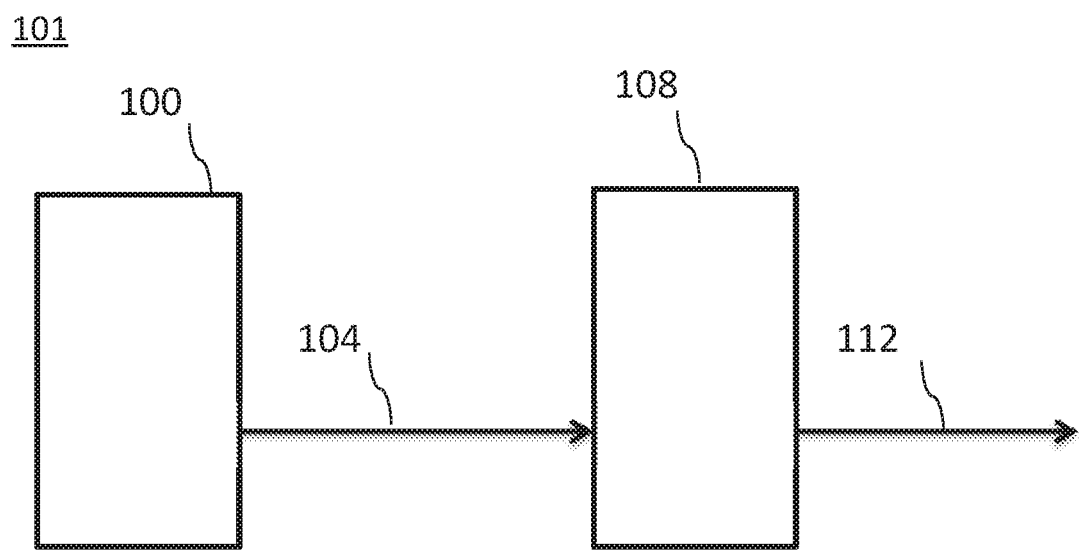
FIG. 1 illustrates an embodiment of a wavelength converting structure as part of an illumination device.

This specification discloses phosphors that can emit infrared ("IR") radiation in the short wave infrared radiation range ("SWIR"), more specifically, phosphors that can emit infrared radiation having a peak wavelength range 1000-1700 nm. The specification discloses phosphors that can be excited with wavelengths in the 600-670 nm spectral range, and that emit infrared radiation with wavelengths in the 1000-1700 nm spectral range. For economy of language, infrared radiation may be referred to herein as "infrared light," "IR light," or "light."

The specification also discloses devices that include a wavelength converting structure formed to include such SWIR emitting phosphors. In particular the specification discloses light sources that include a primary light source, such as an LED, and a wavelength converting structure having an SWIR phosphor material that emits wavelengths in the 1000-1700 nm range. The phosphor materials can efficiently convert shorter wavelength light from the primary light source into broad-band emission with longer wavelengths.

The phosphor converting structure of the devices disclosed herein may further include additional phosphors. The additional phosphors may allow use of a primary light source in the device that emits light in wavelength ranges other than in the 600-670 nm excitation range of the disclosed SWIR phosphors. The additional phosphors may also allow for more efficient excitation of the SWIR phosphors.

The 1000-1700 nm spectral range is interesting for IR absorption spectroscopy applications where traditional incandescent light sources are being applied. For example, polymers that differ in their macromolecular composition can easily be identified by their unique IR absorption patterns in this wavelength range.

Other applications for light sources emitting in the 1000-1700 nm IR spectral range can be found in the medical field, i.e. in sensors and in endoscopic hyper- or multispectral imaging of tissue where efficient, high intensity light sources are especially needed (see for example: Hayashi et al., A broadband LED source in visible to shortwave-infrared wavelengths for spectral tumor diagnostics, Appl. Phys. Lett. 110, 233701 (2017)).

The disclosed light sources are efficient and allow further miniaturization and cost reduction of spectrometers systems, sensors, and hyper- or multispectral imaging systems that cover the 1000-1700 nm wavelength range.

SWIR Phosphor Compositions

SWIR phosphors for down-converting light from the primary light source into the SWIR emission disclosed herein are phosphor materials crystallized into the spinel, perovskite, and/or garnet structure types, and which are doped with $Ni^{2+}$, or $Ni^{2+}$ and $Cr^{3+}$. Such SWIR phosphors include $Ni^{2+}$, or $Ni^{2+}$ and $Cr^{3+}$, doped $XY_2O_4$ spinels, $ABO_3$ perovskites and $M_3B_2T_3O_{12}$ garnets.

Compositions of Spinel Type SWIR Phosphors

Spinels have the general formula $XY_2O_4$, where X is a divalent cation and Y is a trivalent cation, for example, $MgAl_2O_4$, and crystallize in the cubic (isometric) crystal system. Normal spinel structures are cubic close-packed oxides with eight tetrahedral and four octahedral sites per formula unit. The tetrahedral spaces are smaller than the octahedral spaces. $Y^{3+}$ ions occupy half the octahedral holes, while $X^{2+}$ ions occupy one-eighth of the tetrahedral holes. Inverse spinel structures have a different cation distribution in that all of the $X^{2+}$ ions and half of the $Y^{3+}$ ions occupy octahedral sites, while the other half of the $Y^{3+}$ ions occupy tetrahedral sites. Most spinel structures are somewhere between the normal and inverse spinel structure.

Compositions of spinels may have X=AE ("AE" is alkaline earth metal) with a charge of +2, and a Y cation with a charge of +3. However, the spinel structure also forms if X is a cation with charge +1 and Y is a cation with charge +4.

Compositions of spinel type SWIR phosphors that emit light in the 1000-1700 nm range may be $AE_{1-x-z}A_{z+0.5(x-y)}D_{2+0.5(x-y)-z-u}E_zO_4:Ni_y,Cr_u$ with AE=Mg, Zn, Co, Be or mixtures from this group of divalent atoms, A=Li, Na, Cu, Ag or mixtures from this group of monovalent atoms, D=Ga, Al, B, In, Sc or mixtures from this group of trivalent atoms and E=Si, Ge, Sn, Ti, Zr, Hf or mixtures from this group of tetravalent atoms; where $0 \leq x \leq 1$, $0 < y \leq 0.1$, $0 \leq z \leq 1$, $0 \leq u \leq 0.2$.

Compositions of spinel type SWIR phosphors may have X=1 and z=0 (i.e., no AE and no E atoms) and A=Li and D=Ga and Al, Sc, or a mixture of Al and Sc, with Ga being the main component of D (i.e., having a higher concentration than Al and/or Sc). Compositions of SWIR phosphors may have A atoms and D atoms such as Li and Ga replaced by AE atoms such as Mg (A+D replaced by 2 AE to maintain charge neutrality), which the inventors have found leads to a broadening of the emission band and increased emission intensity at lower energies. Substitution of part of the A atoms, such as Li, with AE atoms like Mg can be done without a significant change of properties (x<1). Zn can reduce the optical band gap and the luminescence efficiency. Co has about the same size as Mg, Zn or Li and also shows IR emission. The E atom may be Ge because it is known to form inverse spinel structures with e.g. Li and Ga also present.

Examples of spinel type SWIR phosphors are the inverse spinel phosphors $Li_{0.475}AlGa_{1.475}O_4:Ni_{0.05}$ and $Li_{0.225}Mg_{0.5}Ga_{2.225}O_4:Ni_{0.05}$ with the D cations Ga and Al occupying both the tetrahedral and octahedral sites of the spinel structure. The emission of these phosphors is located in the 1100-1600 nm wavelength range. The absorption and emission bands of these phosphors can be tuned by varying the average size of D cations. The inventors found that D cations larger than Ga, such as In or Sc, lead to a spectroscopic red shift, while cations smaller than Ga, such as Al or B, lead to a spectroscopic blue shift of absorption and emission bands.

Codoping of these inverse spinel SWIR phosphors with $Cr^{3+}$ allows efficient excitation in the blue and red spectral range. The $Cr^{3+}$ ions absorb most of the excitation energy and transfer it to the $Ni^{2+}$ atoms that show broad band luminescence in the 1100-1600 nm wavelength range. An example for such phosphor composition is $Li_{0.49}Sc_{0.05}Ga_{2.384}O_4:Ni_{0.013},Cr_{0.05}$.

In the method for synthesizing the spinel type SWIR phosphor compositions, a flux additive may be used. Flux additives for the inverse spinel phosphors herein may be borate compounds such as lithium tetraborate, $Li_2B_4O_7$. When such a flux additive is used, small amounts of boron may be present in the SWIR phosphors after full processing, and such boron may improve the luminescence intensities.

Compositions of Perovskite Type SWIR Phosphors

Perovskites have the general formula $ABO_3$, where the A cations are larger than the B cations, and have the same type of crystal structure as $CaTiO_3$. In the ideal (non-distorted) perovskite structure, the B cations are surrounded by 6 X anions in the form of an octahedra. The octahedra are connected with each other via corner sharing to form an $ReO_3$-like atomic arrangement with the A cation occupying the 12-fold coordination site formed in the middle of the cube of eight such octahedra.

Compositions of perovskite type SWIR phosphors that emit light in the 1000-1700 nm range are $RET_{1-2p}O_3:Ni_p,Z_p$ with RE=La, Gd, Y, Lu, Yb, Nd, Tm, Er or mixtures from this group of elements and T=Al, Ga, Sc, In, or mixtures from this group of elements, Z=Ti, Hf, Zr, Si, Ge, Sn, or mixtures from this group of elements; $0 < p \leq 0.1$.

An example of a perovskite type SWIR phosphor is $YAl_{0.5}Ga_{0.49}O_3:Ni_{0.005},Ge_{0.005}$ showing peak emission in the 1100-1200 nm wavelength range. As for the case of spinel type phosphors, the $Ni^{2+}$ emission band can be shifted by altering the crystal field strength at the activator site, a larger crystal field strength due to a smaller distances Ni—O within the $NiO_8$ octahedra as a consequence of smaller RE and/or T atoms leads to a spectroscopic blue shift of absorption and emission bands.

Compositions of perovskite type SWIR phosphors may have RE=Y and T=Ga. For such compositions, substitution of Y by La or Gd (Lu, Yb) leads to an emission shift to lower (higher) energies. Substitution by Yb, Nd, Tm or Er leads to additional emission in the IR spectral range, typically f-f line emission. Substitution of Ga by Sc or In (Al) leads to an emission shift to lower (higher) energies.

In some compositions of perovskite type SWIR phosphors, Z atoms with charge +4 are used for charge compensation because $Ni^{2+}$ is incorporated on T site with charge 3+; two $Ga^{3+}$ atoms are e.g. substituted by a $Ni^{2+}$ and $Zr^{4+}$ pair.

Compositions of Garnet Type SWIR Phosphors:

Garnets have a general formula $M_3B_2T_3O_{12}$ and may have a cubic structure. In the cubic garnet structure $M_3B_2T_3O_{12}$, the M is typically a rare earth or alkaline earth metal. The large M cations are surrounded by 8 X anions that form a distorted cube or dodecahedron. The smaller B cations are surrounded by 6 X atoms that form an octahedra, and the smallest T atoms are surrounded by 4 X atoms that form a tetrahedra. The REX8, BX6, and TX4 units are connected via corner and edge sharing to form a complex 3-dimensional network.

Compositions of garnet type SWIR phosphors that emit light in the 1000-1700 nm range are $RE_3AA_{2-2q-s}TT_3O_{12}$:$Ni_q,Z_q,Cr_s$ with RE=La, Gd, Y, Lu, Yb, Nd, Tm, Er, or mixtures from this group of elements, AA=Ga, Sc, In, Al, or Lu, TT=Al, Ga, or mixtures from this group of elements, Z=Ti, Hf, Zr, Si, Ge, Sn, or mixtures from this group of elements; $0<q\leq0.1$, $0<s\leq0.2$.

In some garnet type SWIR phosphor compositions, RE=Gd, Y or Lu and AA=Ga and TT=Ga, Al. The impact of the various substitutions on the IR emission is the same as described for the perovskites.

An example of a garnet type SWIR phosphor is $Gd_3Ga_{3.82}AlO_{12}:Cr_{0.1},Ni_{0.04},Zr_{0.04}$, which shows emission in the 1400-1500 nm wavelength range. $Cr^{3+}$ enhances the absorption in the red spectral range and acts as a sensitizer for the $Ni^{2+}$ luminescence.

For the garnet type SWIR phosphors Z atoms with charge +4 may be used for charge compensation because $Ni^{2+}$ is incorporated on A site with charge 3+; two $Ga^{3+}$ atoms are e.g. substituted by a $Ni^{2+}$ and $Zr^{4+}$ pair.

Illumination Devices Including the SWIR Phosphors

FIG. 1 illustrates a wavelength converting structure 108 that includes at least one of the disclosed luminescent SWIR phosphors. Wavelength converting structure 108 is used in an illumination device 101, which includes primary light source 100. The primary light source 100 may be an LED or any other suitable source including, as examples, resonant cavity light emitting diodes (RCLEDs) and vertical cavity laser diodes (VCSELs). Light source 100 emits a first light 104. A portion of the first light 104 is incident upon a wavelength converting structure 108. The wavelength converting structure 108 absorbs the first light 104 and emits second light 112. The wavelength converting structure 108 may be structured such that little or no first light is part of the final emission spectrum from the device, though this is not required.

Wavelength converting structure 108 may include, for example, one or more of the Ni2+, or Ni2+ and Cr2+ doped spinel, perovskite, and garnet type SWIR phosphors disclosed herein, such that device 101 emits second light 112 in the 1000-1700 nm wavelength range.

The wavelength converting structure 108 may include an SWIR phosphor that can be excited in the red spectral range. In such case, device 101 may include as a primary light source 100 a red emitting LED, emitting first light 104 in the 600-1000 nm wavelength range. In some embodiments, light source 100 is an AlInGaP type emitter and may emit first light 104 having wavelengths in the 600-650 nm range. In other embodiments, light source 100 may be an InGaAs type emitter and may emit first light in the 700-1000 nm wavelength range, to excite the disclose $Ni^{2+}$ doped SWIR phosphors directly via the energetically lowest lying absorption transition.

In an example, device 101 may have a wavelength converting structure 108 that includes $Li_{0.5-0.5x}(Ga,Sc)_{2.5-0.5x-y}O_4:Ni_x,Cr_y$ (where $0\leq x\leq1$, $0<y\leq0.1$, $0\leq z\leq1$, $0\leq u\leq0.2$) spinel type SWIR phosphor, and may use as primary light source 100 a 620-630 nm emitting AlInGaP type LED. More specifically, device 101 may have a wavelength converting structure 108 that includes $Li_{0.49}Sc_{0.05}Ga_{2.384}O_4:Ni_{0.013}$, $Cr_{0.05}$ spinel type SWIR phosphor, and may use as primary light source 100 a 622 nm emitting AlInGaP type LED.

The wavelength converting structure 108 described with respect to FIG. 1 can be manufactured, for example, in powder form, in ceramic form, or in any other suitable form. The wavelength converting structure 108 may be formed into one or more structures that are formed separately from and can be handled separately from the light source, such as a prefabricated glass or ceramic tile, or may be formed into a structure that is formed in situ with the light source, such as a conformal or other coating formed on or above the source.

In some embodiments, the wavelength converting structure 108 may be powders that are dispersed for example in a transparent matrix, a glass matrix, a ceramic matrix, or any other suitable material or structure. SWIR phosphor dispersed in a matrix may be, for example, singulated or formed into a tile that is disposed over a light source. The glass matrix may be for example a low melting glass with a softening point below 1000° C., or any other suitable glass or other transparent material. The ceramic matrix material can be for example a fluoride salt such as $CaF_2$ or any other suitable material.

The wavelength converting structure 108 may be used in powder form, for example by mixing the powder SWIR phosphor with a transparent material such as silicone and dispensing or otherwise disposing it in a path of light. In powder form, the average particle size (for example, particle diameter) of the SWIR phosphors may be at least 1 µm in some embodiments, no more than 50 µm in some embodiments, at least 5 µm in some embodiments, and no more than 20 µm in some embodiments. Individual SWIR phosphor particles, or powder SWIR phosphor layers, may be coated with one or more materials such as a silicate, a phosphate, and/or one or more oxides in some embodiments, for example to improve absorption and luminescence properties and/or to increase the material's functional lifetime.

Figure 2:
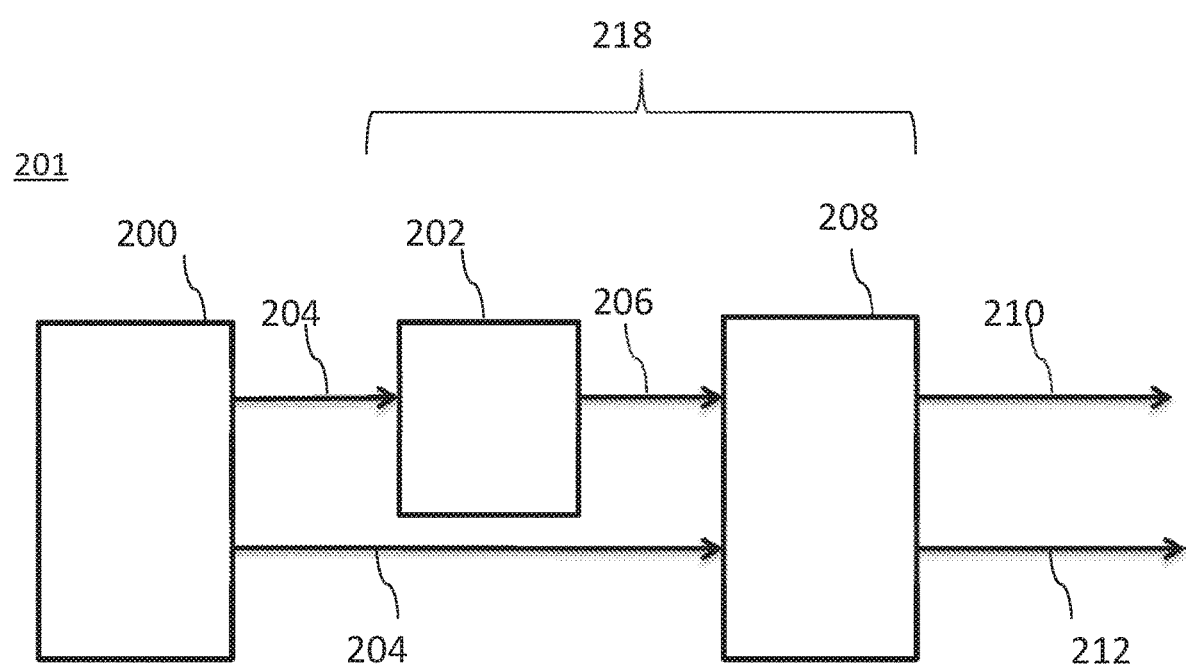
FIG. 2 illustrates another embodiment of a wavelength converting structure as part of an illumination device.

FIG. 2 illustrates another embodiment in which a wavelength converting structure including one or more of the disclosed SWIR phosphor materials may further be combined with a second phosphor system. In FIG. 2, the wavelength converting structure 218 includes an SWIR phosphor portion 208 and a second phosphor portion 202 as part of an illumination device 201. In FIG. 2, a light source 200 may be an LED or any other suitable source, (including as examples resonant cavity light emitting diodes (RCLEDs) and vertical cavity laser diodes (VCSELs). Light source 200 emits first light 204. First light 204 is incident upon wavelength converting structure 218, which includes an SWIR phosphor portion 208 including one or more of the SWIR phosphors disclosed herein, and a second phosphor system 202. A portion of the first light 204 is incident on a second phosphor portion 202 of the wavelength converting structure 218. The second phosphor 202 absorbs the first light 204 and emits third light 206. The third light 206 may have a wavelength range that is within the excitation range of the SWIR phosphor in the SWIR phosphor portion 208 of the wavelength converting structure 218. The third light 206 is incident on the SWIR phosphor portion 208. The SWIR phosphor portion 208 absorbs all or a portion of the third light 206 and emits fourth light 210. Additionally, a portion of the first light 204 may be incident on an SWIR phosphor portion 208 of the wavelength converting structure 218. The SWIR phosphor portion 208 may absorb the first light 204 and emit second light 212, or first light 204 may pass through the SWIR phosphor portion 208.

The wavelength converting structure 218 including an SWIR phosphor 208 and second phosphor 202 may be structured such that little or no first light or third light is part of the final emission spectrum from the device, though this is not required.

The SWIR phosphor portion 208 of wavelength converting structure 218 may include, for example, one or more of the Ni2+, or Ni2+ and Cr2+ spinel, perovskite, and garnet SWIR phosphors disclosed herein, such that device 202 emits light in the 1000-1700 nm wavelength range.

Any suitable second phosphor may be used in the second phosphor system 202. The second phosphor system 202 can be used with SWIR phosphor portion 208 to widen the spectral range that allows efficient excitation of the SWIR phosphor, and thus increase number of the types of primary light sources 200 that may be used in device 201. That is, the second phosphor system 202 may include a second phosphor that absorbs first light 204 from a primary light source 200 that emits light outside of the wavelength range required to excite the SWIR phosphor. For instance, the second phosphor system 202 may absorb first light 204 emitted from a blue or green LED as primary light source 200. The second phosphor system 202 then emits third light 206 in the red spectral range. The third light 206 emitted from second phosphor system 202 excites the SWIR phosphor in SWIR phosphor portion 208.

For example, device 201 may include green to red emitting phosphors, such as Eu2+ phosphors, added as the second phosphor system 202, and may use a blue emitting LED as the primary light source 200. Examples of a red emitting phosphor for use in second phosphor system 202 include $(Sr,Ca)AlSiN_3:Eu$ and $(Ba,Sr,Ca)_2Si_{5-x}Al_xO_xN_{8-x}:Eu$.

In an example device, primary light source 200 may be a blue light emitting InGaN type emitter. The wavelength converting structure 218 may include an orange-red emitting $(Ba,Sr)_2Si_5N_8:Eu$ phosphor as the second phosphor system 202 and a $Li_{0.5-0.5x}(Ga,Sc)_{2.5-0.5x-y}O_4:Ni_x,Cr_y$ spinel phosphor as the SWIR phosphor portion 212. In particular, device 201 may include as a primary light source 200 a 440-455 nm emitting InGaN type emitter, and a wavelength converting structure 218 that includes orange-red emitting phosphor $(Ba_{0.4}Sr_{0.6})_{2-x}Si_5N_8:Eu_{0.02}$ and a $Li_{0.49}Sc_{0.05}Ga_{2.384}O_4:Ni_{0.013},Cr_{0.05}$ SWIR phosphor.

The second phosphor system 202 may include $Cr^{3+}$ doped phosphors that emit in the 700-1000 nm wavelength range and that can be excited in the blue to green and red spectral ranges. The emission light of such Cr3+ phosphors being reabsorbed by doped SWIR phosphor disclosed herein.

The second phosphor system 202 may include other $Ni^{2+}$ phosphor systems that are known from the literature. Examples include $LaMgGa_{11}O_{19}:Ni$, $MgO:Ni$, $MgF_2:Ni$, $Ga_2O_3:Ni,Ge$, or garnets of composition $RE_2AEMg_2TV_3O_{12}:Ni$ (RE=Y, La, Lu, Gd, Nd, Yb, Tm, Er; AE=Ca, Sr; TV=Si, Ge).

The wavelength converting structure 218 including SWIR phosphor 208 and the second phosphor 202 described with respect to FIG. 2 can be manufactured, for example, in powder form, in ceramic form, or in any other suitable form. The SWIR phosphor 208 and the second phosphor 202 may be formed into one or more structures that are formed separately from and can be handled separately from the light source, such as a prefabricated glass or ceramic tile, or may be formed into a structure that is formed in situ with the light source, such as a conformal or other coating formed on or above the source.

The SWIR phosphor 208 and the second phosphor 202 may be mixed together in a single wavelength converting layer, or formed as separate wavelength converting layers. In a wavelength converting structure with separate wavelength converting layers, SWIR phosphor 208 and the second phosphor 202 may be stacked such that the second phosphor 202 may be disposed between the SWIR phosphor 208 and the light source, or the SWIR phosphor 208 may be disposed between the second phosphor 202 and the light source.

In some embodiments, the SWIR phosphor 208 and the second phosphor 202 may be powders that are dispersed for example in a transparent matrix, a glass matrix, a ceramic matrix, or any other suitable material or structure. Phosphor dispersed in a matrix may be, for example, singulated or formed into a tile that is disposed over a light source. The glass matrix may be for example a low melting glass with a softening point below 1000° C., or any other suitable glass or other transparent material. The ceramic matrix material can be for example a fluoride salt such as $CaF_2$ or any other suitable material.

The SWIR phosphor 208 and second phosphor 202 may be used in powder form, for example by mixing the powder phosphor with a transparent material such as silicone and dispensing or otherwise disposing it in a path of light. In powder form, the average particle size (for example, particle diameter) of the phosphors may be at least 1 μm in some embodiments, no more than 50 μm in some embodiments, at least 5 μm in some embodiments, and no more than 20 μm in some embodiments. Individual phosphor particles, or powder phosphor layers, may be coated with one or more materials such as a silicate, a phosphate, and/or one or more oxides in some embodiments, for example to improve absorption and luminescence properties and/or to increase the material's functional lifetime.

Figure 3:
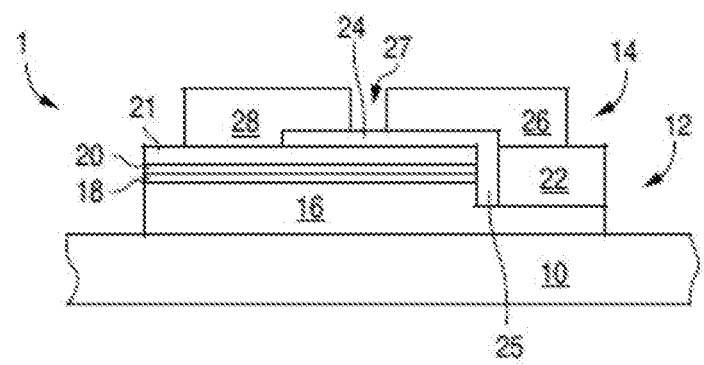
FIG. 3 is a cross sectional view of an LED.

As shown in FIGS. 1 and 2, an illumination device may include a wavelength converting structure that may be used, for example, with light source 100, 200. Light source 100, 200 may be a light emitting diode (LED). Light emitted by the light emitting diode is absorbed by the phosphors in the wavelength converting structure according to embodiments and emitted at a different wavelength. FIG. 3 illustrates one example of a suitable light emitting diode, a III-nitride LED that emits blue light for use in an illumination device such as those disclosed with respect to FIG. 2, in which the SWIR phosphor is combined with a second phosphor that absorbs the blue light and emits the SWIR light.

Though in the example below the semiconductor light emitting device is a III-nitride LED that emits blue or UV light, semiconductor light emitting devices besides LEDs such as laser diodes and semiconductor light emitting devices made from other materials systems such as other III-V materials, III-phosphide, III-arsenide, II-VI materials, ZnO, or Si-based materials may be used, as determined by, for example, the range of wavelengths needed to excite the SWIR phosphor, or combination of SWIR phosphor and second phosphor, in the wavelength converting structure.

FIG. 3 illustrates a III-nitride LED 1 that may be used in embodiments of the present disclosure. Any suitable semiconductor light emitting device may be used and embodiments of the disclosure are not limited to the device illustrated in FIG. 3. The device of FIG. 3 is formed by growing a III-nitride semiconductor structure on a growth substrate 10 as is known in the art. The growth substrate is often sapphire but may be any suitable substrate such as, for example, SiC, Si, GaN, or a composite substrate. A surface of the growth substrate on which the III-nitride semiconductor structure is grown may be patterned, roughened, or textured before growth, which may improve light extraction from the device. A surface of the growth substrate opposite the growth surface (i.e. the surface through which a majority of light is extracted in a flip chip configuration) may be patterned, roughened or textured before or after growth, which may improve light extraction from the device.

The semiconductor structure includes a light emitting or active region sandwiched between n- and p-type regions. An n-type region 16 may be grown first and may include multiple layers of different compositions and dopant concentration including, for example, preparation layers such as buffer layers or nucleation layers, and/or layers designed to facilitate removal of the growth substrate, which may be n-type or not intentionally doped, and n- or even p-type device layers designed for particular optical, material, or electrical properties desirable for the light emitting region to efficiently emit light. A light emitting or active region 18 is grown over the n-type region. Examples of suitable light emitting regions include a single thick or thin light emitting layer, or a multiple quantum well light emitting region including multiple thin or thick light emitting layers separated by barrier layers. A p-type region 20 may then be grown over the light emitting region. Like the n-type region, the p-type region may include multiple layers of different composition, thickness, and dopant concentration, including layers that are not intentionally doped, or n-type layers.

After growth, a p-contact is formed on the surface of the p-type region. The p-contact 21 often includes multiple conductive layers such as a reflective metal and a guard metal which may prevent or reduce electromigration of the reflective metal. The reflective metal is often silver but any suitable material or materials may be used. After forming the p-contact 21, a portion of the p-contact 21, the p-type region 20, and the active region 18 is removed to expose a portion of the n-type region 16 on which an n-contact 22 is formed. The n- and p-contacts 22 and 21 are electrically isolated from each other by a gap 25 which may be filled with a dielectric such as an oxide of silicon or any other suitable material. Multiple n-contact vias may be formed; the n- and p-contacts 22 and 21 are not limited to the arrangement illustrated in FIG. 3. The n- and p-contacts may be redistributed to form bond pads with a dielectric/metal stack, as is known in the art.

In order to form electrical connections to the LED 1, one or more interconnects 26 and 28 are formed on or electrically connected to the n- and p-contacts 22 and 21. Interconnect 26 is electrically connected to n-contact 22 in FIG. 3. Interconnect 28 is electrically connected to p-contact 21. Interconnects 26 and 28 are electrically isolated from the n- and p-contacts 22 and 21 and from each other by dielectric layer 24 and gap 27. Interconnects 26 and 28 may be, for example, solder, stud bumps, gold layers, or any other suitable structure.

The substrate 10 may be thinned or entirely removed. In some embodiments, the surface of substrate 10 exposed by thinning is patterned, textured, or roughened to improve light extraction.

Any suitable light emitting device may be used in light sources according to embodiments of the disclosure. The invention is not limited to the particular LED illustrated in FIG. 3. The light source, such as, for example, the LED illustrated in FIG. 3, is illustrated in the following FIGS. 4, 5 and 6 by block 1.

Figure 4:
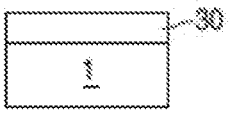
FIG. 4 is a cross sectional view of a device with a wavelength converting structure in direct contact with an LED.
Figure 5:
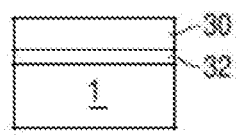
FIG. 5 is a cross sectional view of a device with a wavelength converting structure in close proximity to an LED.
Figure 6:
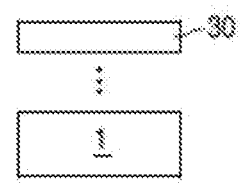
FIG. 6 is a cross sectional view of a device with a wavelength converting structure spaced apart from an LED.

FIGS. 4, 5, and 6 illustrate devices that combine an LED 1 and a wavelength converting structure 30. The wavelength converting structure 30 may be, for example, wavelength converting structure 108 including an SWIR phosphor as shown in FIG. 1, or wavelength converting structure 218 having an SWIR phosphor and a second phosphor as shown in FIG. 2, according to the embodiments and examples described above.

In FIG. 4, the wavelength converting structure 30 is directly connected to the LED 1. For example, the wavelength converting structure may be directly connected to the substrate 10 illustrated in FIG. 3, or to the semiconductor structure, if the substrate 10 is removed.

In FIG. 5, the wavelength converting structure 30 is disposed in close proximity to LED 1, but not directly connected to the LED 1. For example, the wavelength converting structure 30 may be separated from LED 1 by an adhesive layer 32, a small air gap, or any other suitable structure. The spacing between LED 1 and the wavelength converting structure 30 may be, for example, less than 500 μm in some embodiments.

In FIG. 6, the wavelength converting structure 30 is spaced apart from LED 1. The spacing between LED 1 and the wavelength converting structure 30 may be, for example, on the order of millimeters in some embodiments. Such a device may be referred to as a "remote phosphor" device.

The wavelength converting structure 30 may be square, rectangular, polygonal, hexagonal, circular, or any other suitable shape. The wavelength converting structure may be the same size as LED 1, larger than LED 1, or smaller than LED 1.

Multiple wavelength converting materials and multiple wavelength converting structures can be used in a single device. Examples of wavelength converting structures include luminescent ceramic tiles; powder phosphors that are disposed in transparent material such as silicone or glass that is rolled, cast, or otherwise formed into a sheet, then singulated into individual wavelength converting structures; wavelength converting materials such as powder phosphors that are disposed in a transparent material such as silicone that is formed into a flexible sheet, which may be laminated or otherwise disposed over an LED 1, wavelength converting materials such as powder phosphors that are mixed with a transparent material such as silicone and dispensed, screen printed, stenciled, molded, or otherwise disposed over LED 1; and wavelength converting materials that are coated on LED 1 or another structure by electrophoretic, vapor, or any other suitable type of deposition.

A device may also include other wavelength converting materials in addition to the SWIR phosphor and a second phosphor described above, such as, for example, conventional phosphors, organic phosphors, quantum dots, organic semiconductors, II-VI or III-V semiconductors, II-VI or III-V semiconductor quantum dots or nanocrystals, dyes, polymers, or other materials that luminesce.

Multiple wavelength converting materials may be mixed together or formed as separate structures.

In some embodiments, other materials may be added to the wavelength converting structure or the device, such as, for example, materials that improve optical performance, materials that encourage scattering, and/or materials that improve thermal performance.

EXAMPLES

1) Synthesis of $Li_{0.532}Ga_{2.35}Sc_{0.1}O_4:Ni_{0.051}$

Compositions of $Li_{0.532}Ga_{2.35}Sc_{0.1}O_4:Ni_{0.051}$ were synthesized from powders of lithium carbonate (Alfa Aesar, 99.998%), gallium oxide (Molycorp, UHP grade), scandium oxide (MIRE Ltd., 5N) and nickel oxide (Alfa Aesar, 99.99%). 1.595 g of the lithium carbonate, 17.914 g of the gallium oxide, 0.567 g of the scandium oxide, and 0.301 g of the nickel oxide were mixed by ball milling and fired twice at 1300° C. with intermediate milling followed by ball milling, powder washing in water, and final screening.

The obtained powder of $Li_{0.532}Ga_{2.35}Sc_{0.1}O_4:Ni_{0.051}$ crystallized in the inverse spinel structure with a cubic lattice constant of 8.223 Å and a density of 5.812 g/cm$^3$.

Figure 7:
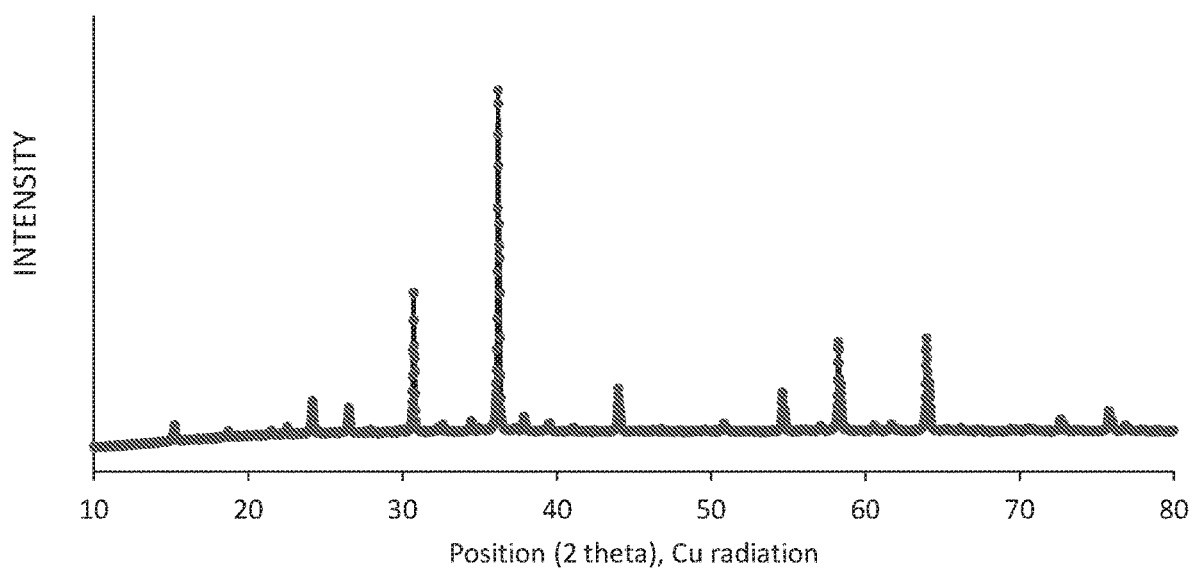
FIG. 7 shows the X ray powder diffraction (XRD) pattern (Cu k alpha radiation) of the obtained $Li_{0.532}Ga_{2.35}Sc_{0.1}O_4:Ni_{0.051}$.
Figure 8:
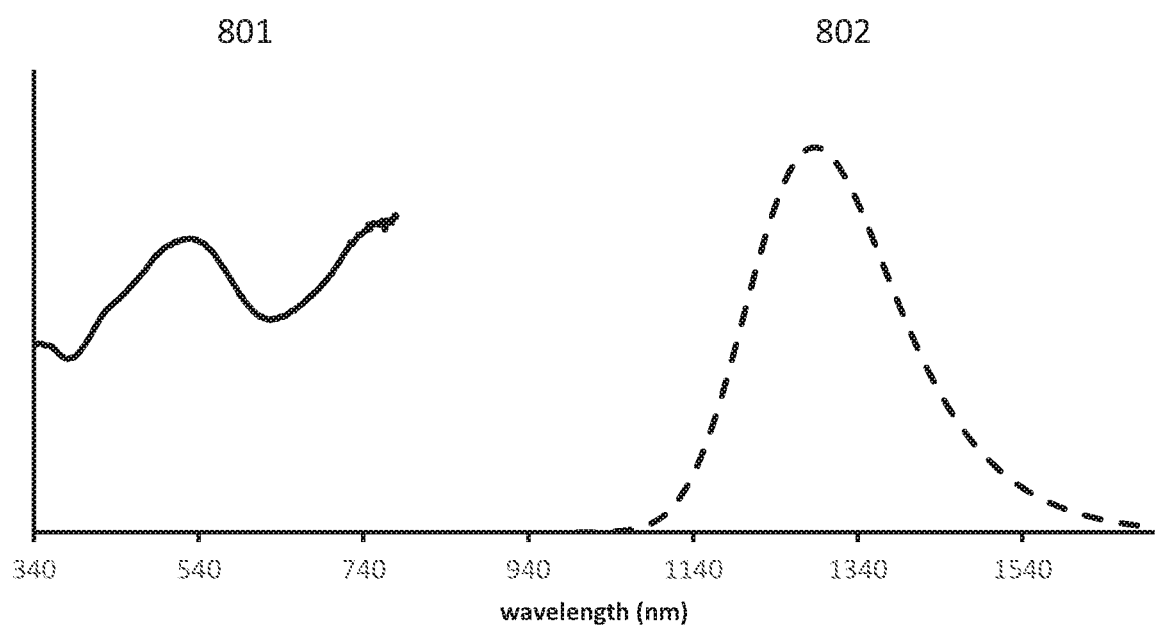
FIG. 8 shows the powder reflectance and emission (620 nm excitation) spectra of the obtained $Li_{0.532}Ga_{2.35}Sc_{0.1}O_4:Ni_{0.051}$.

FIG. 7 shows the X ray powder pattern (Cu k alpha radiation) of the obtained $Li_{0.532}Ga_{2.35}Sc_{0.1}O_4:Ni_{0.051}$. FIG. 8 shows the powder reflectance 801 and emission (620 nm excitation) spectra 802 of the obtained $Li_{0.532}Ga_{2.35}Sc_{0.1}O_4:Ni_{0.051}$.

2) Synthesis of $Li_{0.536}Al_{1.01}Ga_{1.44}O_4:Ni_{0.051}$

Compositions of $Li_{0.536}Al_{1.01}Ga_{1.44}O_4:Ni_{0.051}$ were synthesized from powders of lithium carbonate (Alfa Aesar, 99.998%), gallium oxide (Molycorp, UHP grade), aluminum oxide (Baikowski, 4N) and nickel oxide (Alfa Aesar, 99.99%). 1.968 g of the lithium carbonate, 13.42 g of the gallium oxide, 5.123 g of the aluminum oxide, and 0.375 g of the nickel oxide were mixed by ball milling and fired twice at 1325° C. with intermediate milling followed by ball milling, powder washing in water, and final screening.

The obtained $Li_{0.536}Al_{1.01}Ga_{1.44}O_4:Ni_{0.051}$ powder crystallized in the inverse spinel structure with a cubic lattice constant of 8.086 Å and a density of 5.001 g/cm$^3$.

Figure 9:
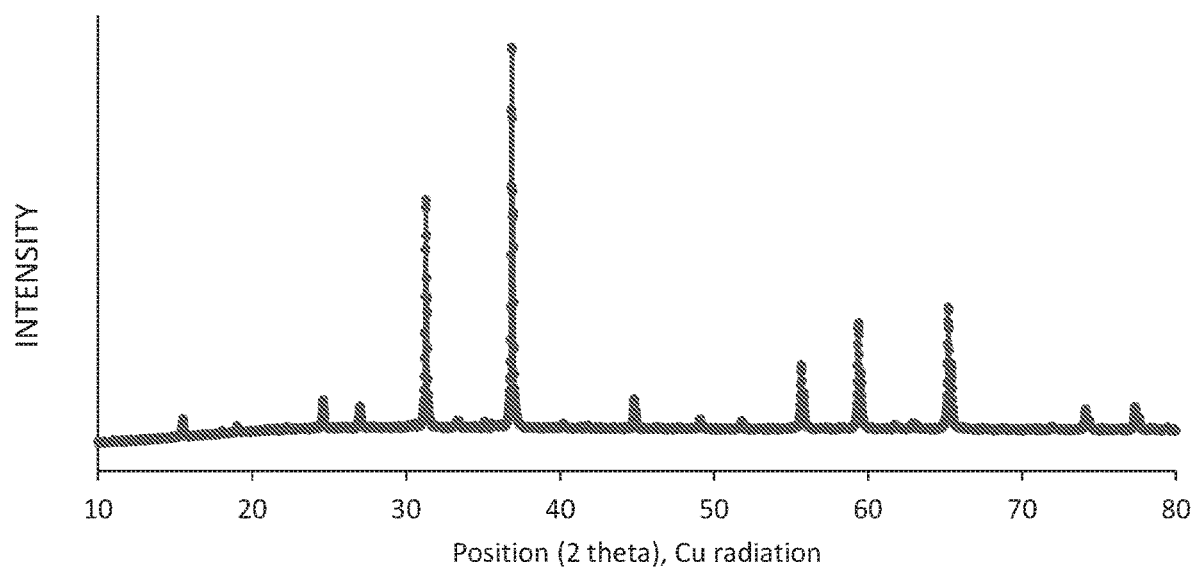
FIG. 9 shows the X ray powder pattern (Cu k alpha radiation) of the obtained $Li_{0.536}Al_{1.01}Ga_{1.44}O_4:Ni_{0.051}$.
Figure 10:
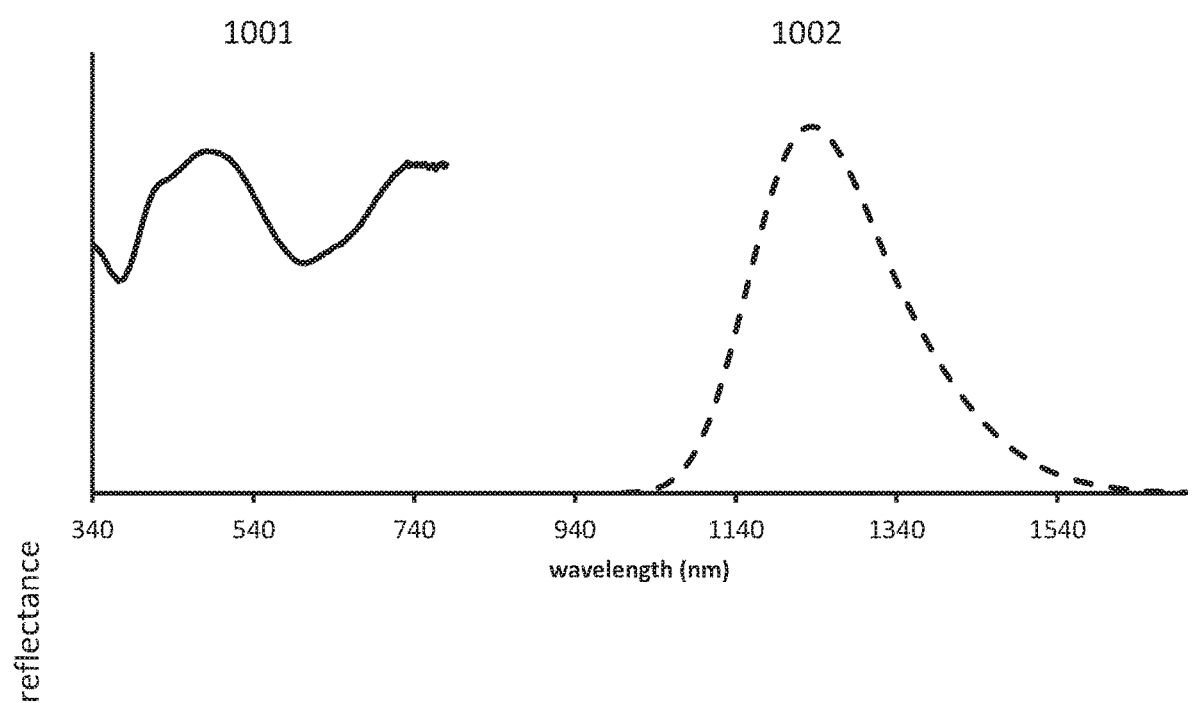
FIG. 10 shows the powder reflectance and emission (620 nm excitation) spectra of the obtained $Li_{0.536}Al_{1.01}Ga_{1.44}O_4:Ni_{0.051}$.

FIG. 9 shows the X ray powder pattern (Cu k alpha radiation) of the obtained $Li_{0.536}Al_{1.01}Ga_{1.44}O_4:Ni_{0.051}$. FIG. 10 shows the powder reflectance 1001 and emission (620 nm excitation) spectra 1002 of the obtained $Li_{0.536}Al_{1.01}Ga_{1.44}O_4:Ni_{0.051}$.

3) Synthesis of $Li_{0.273}Mg_{0.5}Sc_{0.05}Ga_{2.16}O_4:Ni_{0.05}$

Compositions of $Li_{0.273}Mg_{0.5}Sc_{0.05}Ga_{2.16}O_4:Ni_{0.05}$ were synthesized from powders of lithium carbonate (Merck, p.a.), magnesium oxide (Merck, p.a.), gallium oxide (Molycorp, UHP grade), scandium oxide (MIRE Ltd., 5N), and nickel oxide (Alfa Aesar, 99.99%). 0.935 g of the lithium carbonate, 1.854 g of the magnesium oxide, 18.755 g of the gallium oxide, 0.317 g of the scandium oxide, and 0.344 g of the nickel oxide were mixed by ball milling and fired twice at 1100° C. and 1350° C., respectively, with intermediate milling followed by ball milling, powder washing in water, and final screening.

The obtained $Li_{0.273}Mg_{0.5}Sc_{0.05}Ga_{2.16}O_4:Ni_{0.05}$ powder crystallized in the inverse spinel structure with a cubic lattice constant of 8.2312 Å and a density of 5.178 g/cm$^3$.

Figure 11:
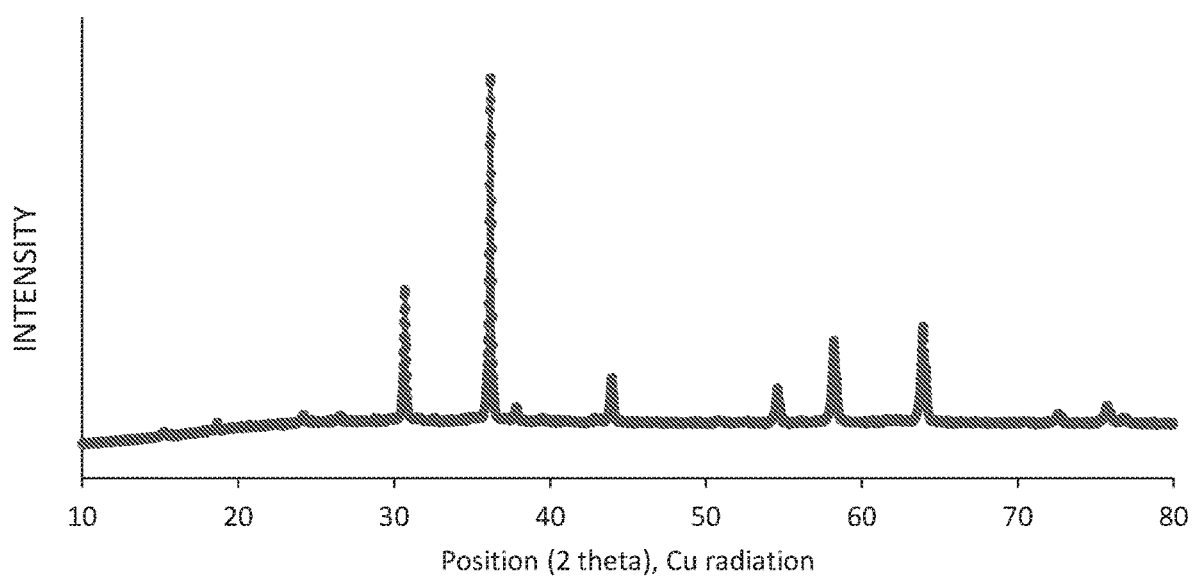
FIG. 11 shows the X ray powder pattern (Cu k alpha radiation) of the obtained $Li_{0.273}Mg_{0.5}Sc_{0.05}Ga_{2.16}O_4:Ni_{0.05}$.
Figure 12:
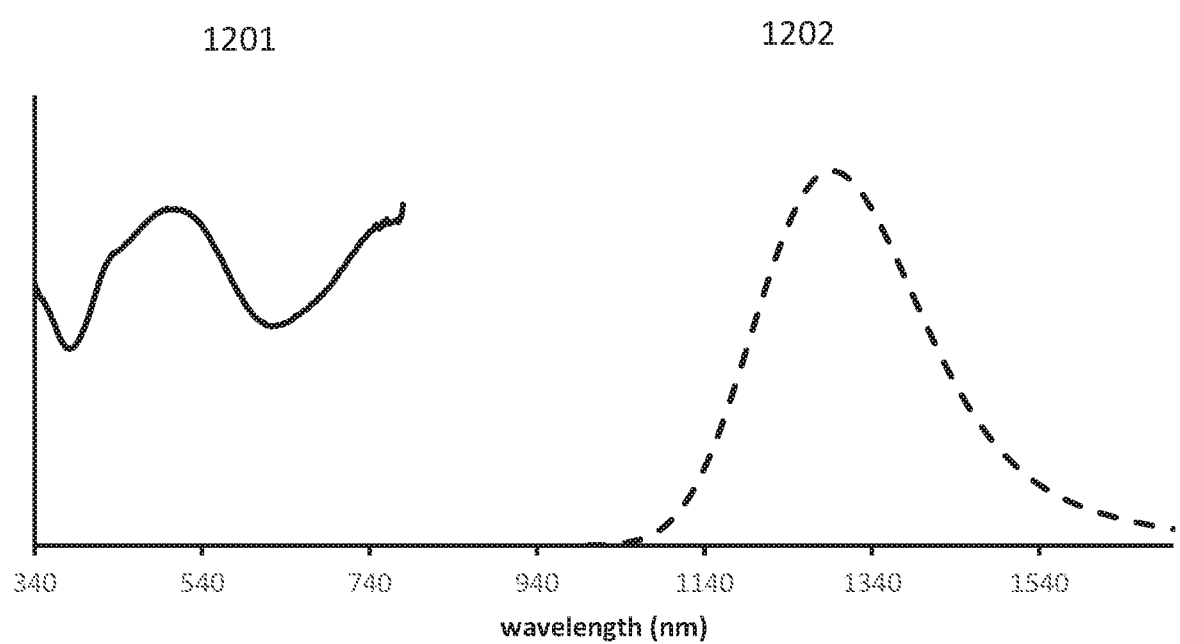
FIG. 12 shows the powder reflectance and emission (620 nm excitation) spectra of the obtained $Li_{0.273}Mg_{0.5}Sc_{0.05}Ga_{2.16}O_4:Ni_{0.05}$.

FIG. 11 shows the X ray powder pattern (Cu k alpha radiation) of the obtained $Li_{0.273}Mg_{0.5}Sc_{0.05}Ga_{2.16}O_4:Ni_{0.05}$. FIG. 12 shows the powder reflectance 1201 and emission (620 nm excitation) spectra 1202 of the obtained $Li_{0.273}Mg_{0.5}Sc_{0.05}Ga_{2.16}O_4:Ni_{0.05}$.

4) Synthesis of $Gd_3Ga_{3.82}AlO_{12}:Ni_{0.04},Zr_{0.04},Cr_{0.1}$

Compositions of $Gd_3Ga_{3.82}AlO_{12}:Ni_{0.04},Zr_{0.04},Cr_{0.1}$ were synthesized from powders of gallium oxide (Alfa Aesar, Puratronic), gadolinium fluoride (Rhodia, 4N), zirconium oxide (Daichi, 5N), nickel oxide (Alfa Aesar, 4N), gadolinium oxide (Liyang Solvay, 5N), chromium oxide (Alfa Aesar, 2N5), and aluminum oxide (Baikowski, 4N). 7.4711 g of the gallium oxide, 0.1326 g of the gadolinium fluoride, 0.1026 g of the zirconium oxide, 0.0616 g of the nickel oxide, 11.2757 g of the gadolinium oxide, 0.1568 g of the chromium oxide, and 1.0864 g of the aluminum oxide were wet mixed by ball milling in ethanol followed by drying. The powder mixture was fired 1500° C. for at least 8 hrs and cooled to room temperature. The obtained $Gd_3Ga_{3.82}AlO_{12}:Ni_{0.04},Zr_{0.04},Cr_{0.1}$ powder cake was de-aggregated by ball milling, washed with water, and finally screened to obtain the desired particle size distribution.

The obtained $Gd_3Ga_{3.82}AlO_{12}:Ni_{0.04},Zr_{0.04},Cr_{0.1}$ powder crystallized in the garnet structure with a cubic lattice constant of 12.312 Å and a density of 6.906 g/cm$^3$.

Figure 13:
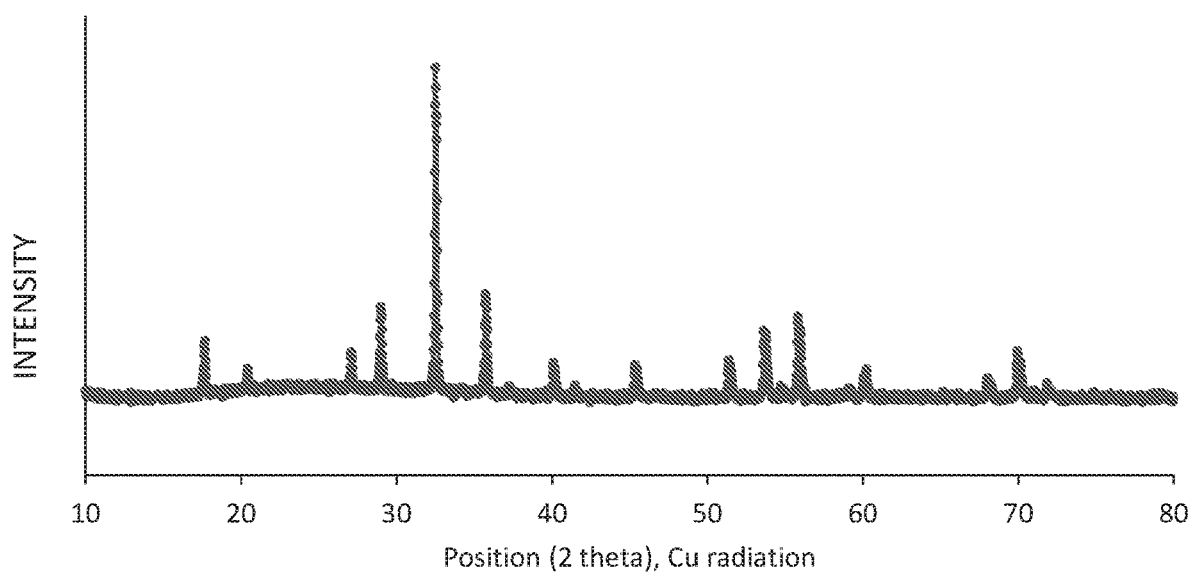
FIG. 13 shows the X ray powder pattern (Cu k alpha radiation) of the obtained $Gd_3Ga_{3.82}AlO_{12}:Ni_{0.04},Zr_{0.04},Cr_{0.1}$.
Figure 14:
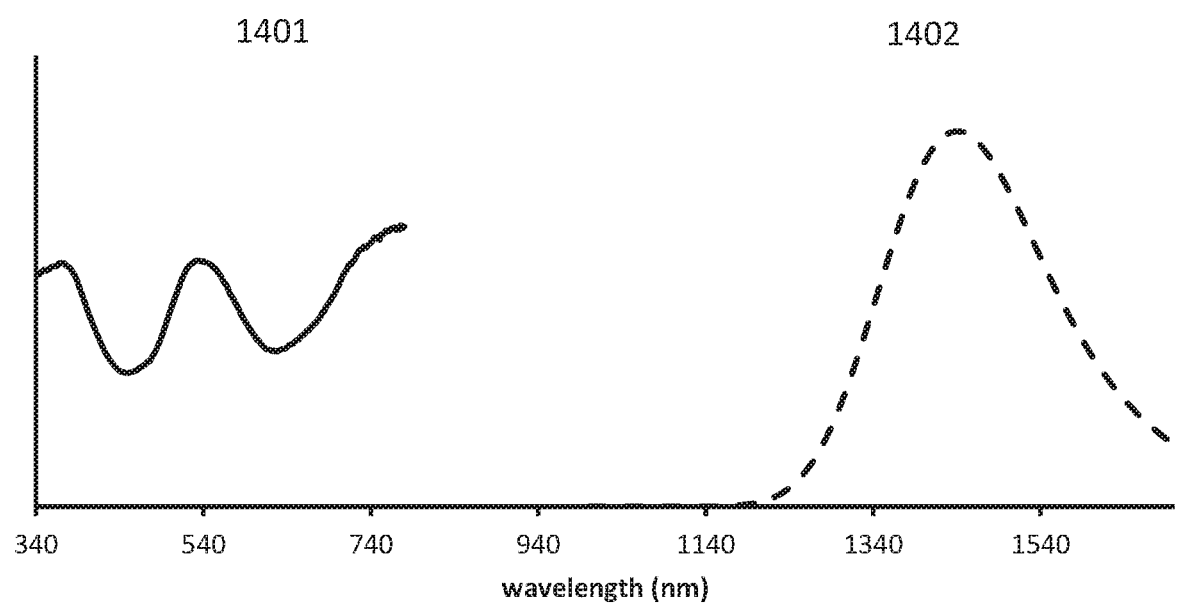
FIG. 14 shows the powder reflectance and emission (620 nm excitation) spectra of the obtained $Gd_3Ga_{3.82}AlO_{12}:Ni_{0.04},Zr_{0.04},Cr_{0.1}$.

FIG. 13 shows the X ray powder pattern (Cu k alpha radiation) of the obtained $Gd_3Ga_{3.82}AlO_{12}:Ni_{0.04},Zr_{0.04},Cr_{0.1}$. FIG. 14 shows the powder reflectance 1401 and emission (620 nm excitation) spectra 1402 of the obtained $Gd_3Ga_{3.82}AlO_{12}:Ni_{0.04},Zr_{0.04},Cr_{0.1}$.

5) Synthesis of $Li_{0.49}Sc_{0.05}Ga_{2.384}O_4:Ni_{0.013},Cr_{0.05}$

Compositions of $Li_{0.49}Sc_{0.05}Ga_{2.384}O_4:Ni_{0.013},Cr_{0.05}$ were synthesized from powders of lithium carbonate (Merck p.a.), gallium oxide (Molycorp UHP), nickel oxide (Sigma Aldrich, 99%), scandium oxide (MIRE Ltd., 5N), lithium tetraborate (Alfa Aesar, 98%), and chromium oxide (Alfa Aeasar, >98%). 1.517 g of the lithium carbonate, 18.654 g of the gallium oxide, 0.078 g of the nickel oxide, 0.287 g of the scandium oxide, 0.176 g of the lithium tetraborate, and 0.316 g of the chromium oxide were mixed by ball milling and fired at 1300° C. for 4 hrs under ambient conditions. The raw product was milled, washed with diluted hydrochloric acid and water. After screening a powder sample was obtained that crystallized in the cubic spinel structure type with a lattice constant of 8.2127 Å and a density of 5.769 g/cm$^3$.

Figure 15:
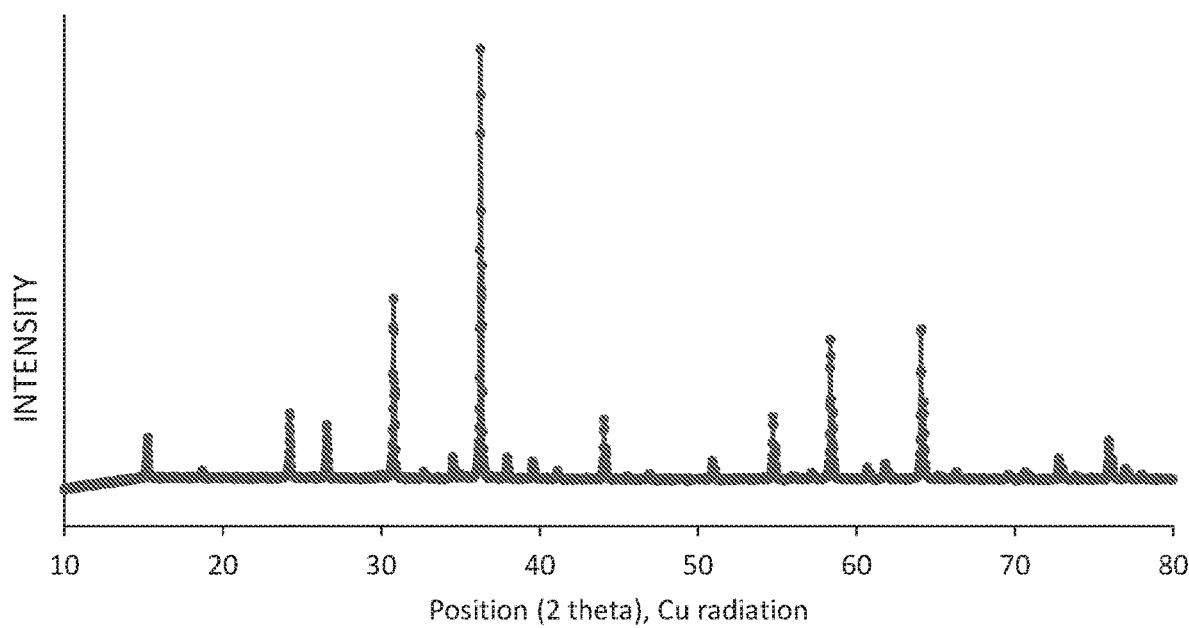
FIG. 15 shows the X ray powder pattern (Cu k alpha radiation) of the obtained $Li_{0.49}Sc_{0.05}Ga_{2.384}O_4:Ni_{0.013},Cr_{0.05}$.
Figure 16:
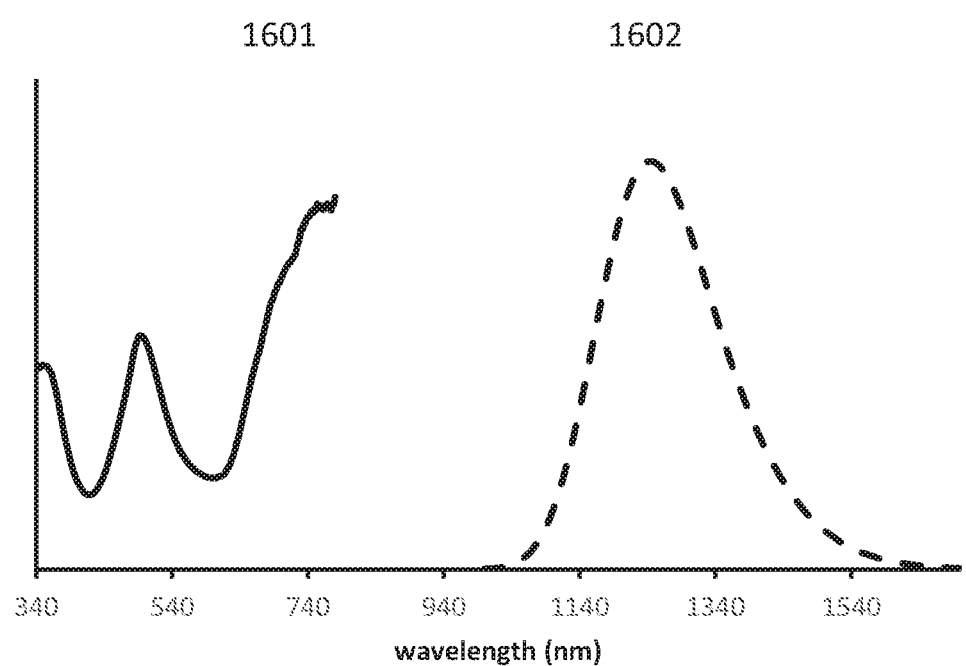
FIG. 16 shows the powder reflectance spectrum and emission spectrum (for 620 nm excitation) of the obtained $Li_{0.49}Sc_{0.05}Ga_{2.384}O_4:Ni_{0.013},Cr_{0.05}$.
Figure 17:
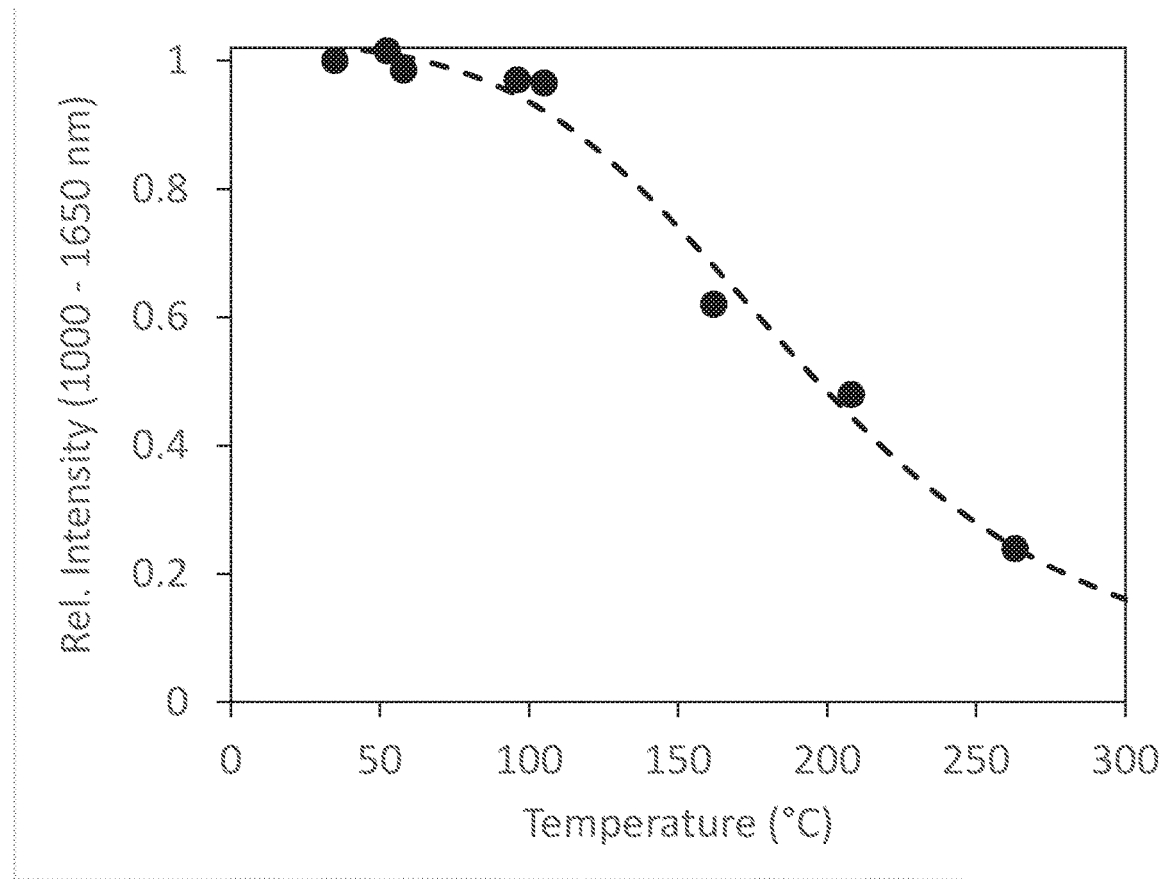
FIG. 17 shows the thermal quenching behavior of emission under 620 nm excitation of the obtained $Li_{0.49}Sc_{0.05}Ga_{2.384}O_4:Ni_{0.013},Cr_{0.05}$.

FIG. 15 shows the X ray powder pattern (Cu k alpha radiation) of the obtained $Li_{0.49}Sc_{0.05}Ga_{2.384}O_4:Ni_{0.013},Cr_{0.05}$. FIG. 16 shows the powder reflectance spectrum 1601 and emission spectrum (for 620 nm excitation) 1602, and FIG. 17 shows the thermal quenching behavior of emission under 620 nm excitation of the obtained $Li_{0.49}Sc_{0.05}Ga_{2.384}O_4:Ni_{0.013},Cr_{0.05}$.

6) Synthesis of $Li_{0.49}Al_{0.05}Ga_{2.384}O_4:Ni_{0.013},Cr_{0.05}$

Compositions of $Li_{0.49}Al_{0.05}Ga_{2.384}O_4:Ni_{0.013},Cr_{0.05}$ were synthesized from powders of lithium carbonate (Merck p.a.), gallium oxide (Molycorp UHP), nickel oxide (Sigma Aldrich, 99%), aluminum oxide (Baikowski, >99%), lithium tetraborate (Alfa Aesar, 98%), and chromium oxide (Alfa Aeasar, >98%). 1.522 g of the lithium carbonate, 18.724 g of the gallium oxide, 0.078 g of the nickel oxide, 0.213 g of the aluminum oxide, 0.176 g of the lithium tetraborate, and 0.317 g of the chromium oxide were mixed by ball milling and fired at 1320° C. for 4 hrs under ambient conditions. The raw product was milled, washed with diluted hydrochloric acid and water. After screening a powder sample was obtained that crystallized in the cubic spinel structure type with a lattice constant of 8.1975 Å and a density of 5.779 g/cm$^3$.

Figure 18:
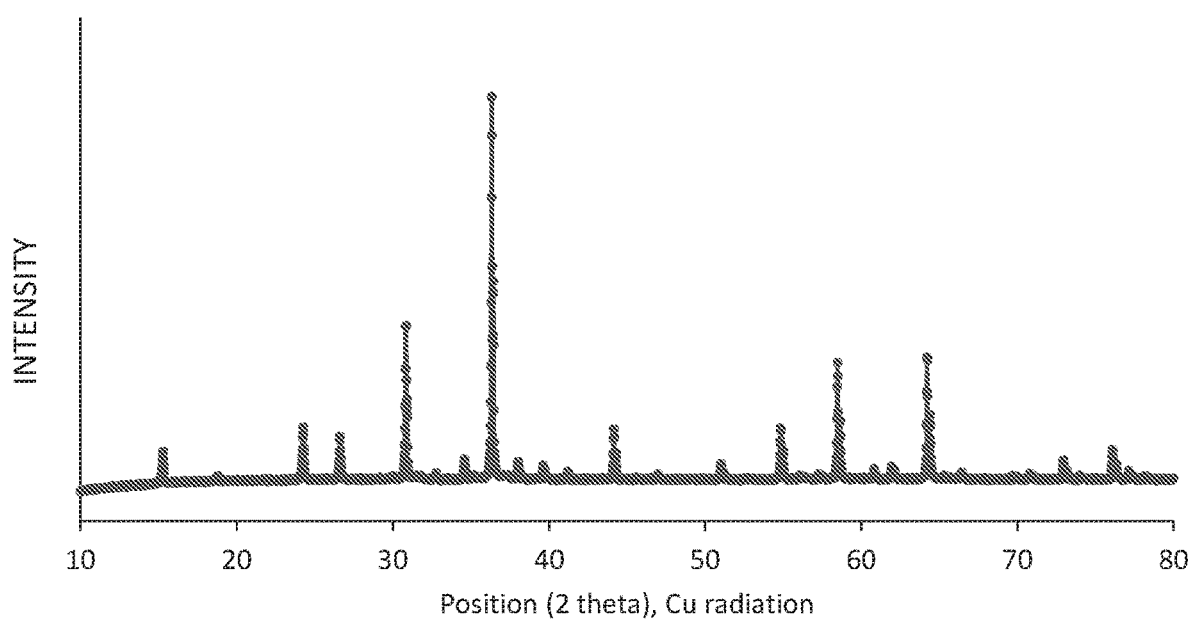
FIG. 18 shows the X ray powder pattern (Cu k alpha radiation) of the obtained $Li_{0.49}Al_{0.05}Ga_{2.384}O_4:Ni_{0.013},Cr_{0.05}$.
Figure 19:
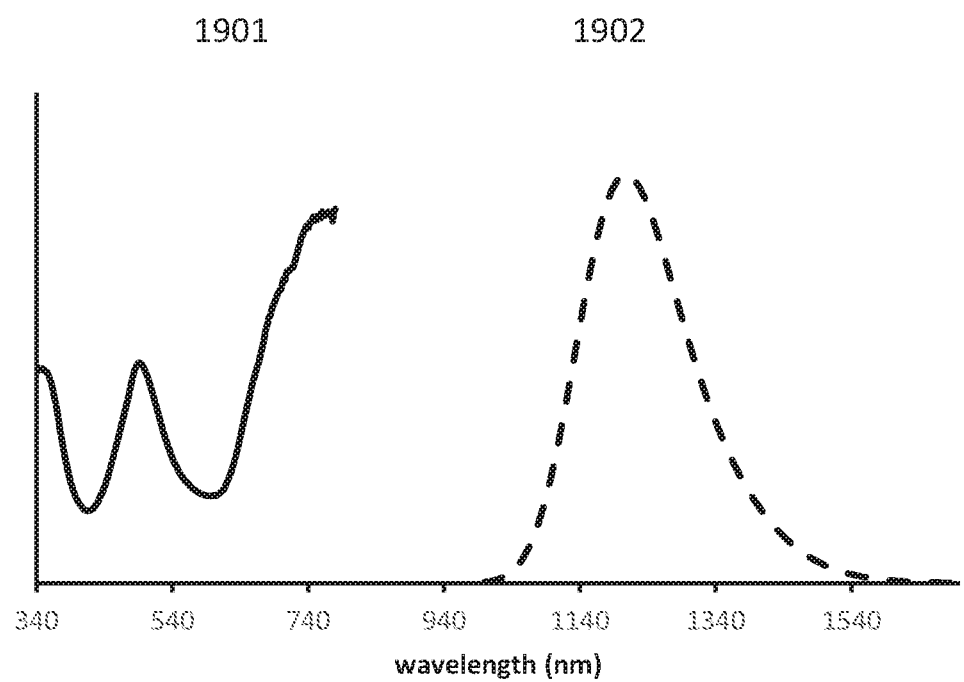
FIG. 19 shows the powder reflectance spectrum and emission spectrum (for 620 nm excitation) of the obtained $Li_{0.49}Al_{0.05}Ga_{2.384}O_4:Ni_{0.013},Cr_{0.05}$.

FIG. 18 shows the X ray powder pattern (Cu k alpha radiation) of the obtained $Li_{0.49}Al_{0.05}Ga_{2.384}O_4:Ni_{0.013}$, $Cr_{0.05}$. FIG. 19 shows the powder reflectance spectrum 1901 and emission spectrum 1902 (for 620 nm excitation) of the obtained $Li_{0.49}Al_{0.05}Ga_{2.384}O_4:Ni_{0.013},Cr_{0.05}$.

7) Example of a Phosphor Converted LED with a 2-Phosphor Mix

Figure 20:
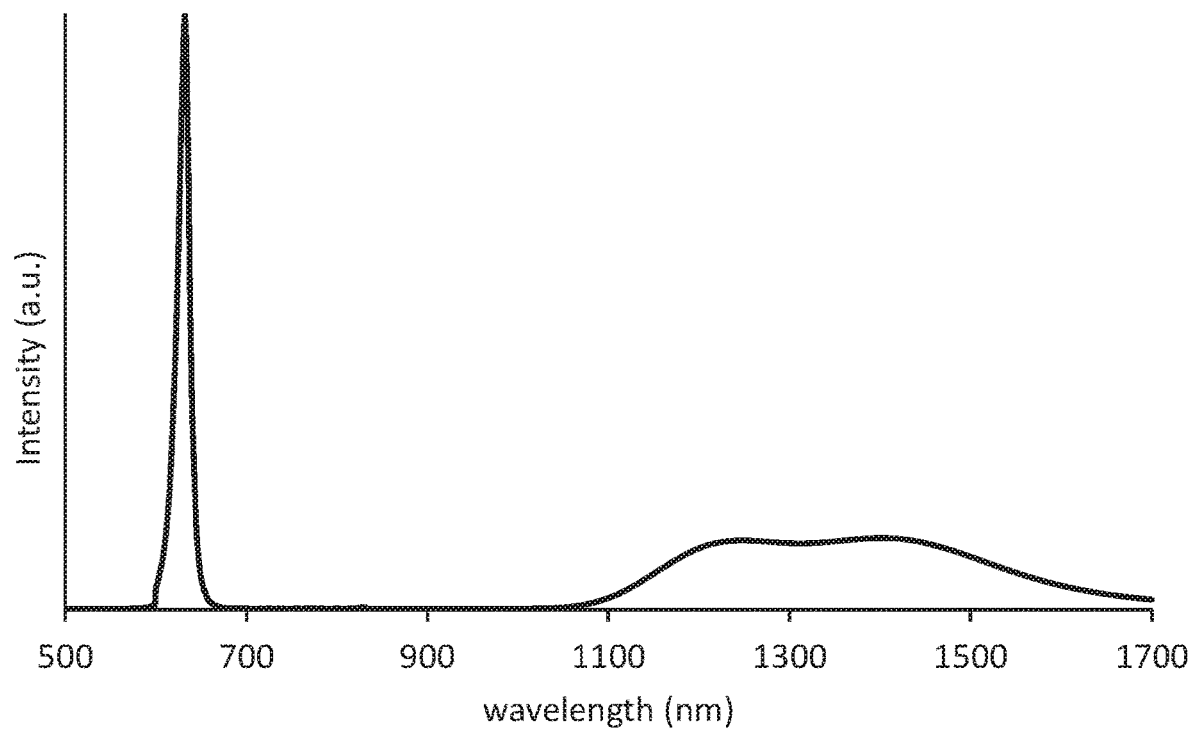
FIG. 20 shows the simulated emission spectrum of a pc LED with a phosphor mix.

FIG. 20 shows a simulated emission spectrum of a phosphor converted LED device that will consist of a 625 nm peak emitting AlInGaP LED combined with a mixture of $Li_{0.536}Al_{1.01}Ga_{1.44}O_4:Ni_{0.051}$ spinel type phosphor synthesized as described with respect to Example 2 and $Gd_3Ga_{3.82}AlO_{12}:Ni_{0.04},Zr_{0.04},Cr_{0.1}$ garnet type phosphor synthesized as described with respect to Example 4. By combining these phosphors an IR spectrum with a broad FWHM>350 nm covering the wavelength range of 1100-1700 nm can be realized.

8) Example of a Phosphor Converted LED with Red Emitting Pump LED

The $Li_{0.49}Sc_{0.05}Ga_{2.384}O_4:Ni_{0.013},Cr_{0.05}$ spinel type phosphor synthesized as described in Example 5 was mixed with a PDMS type silicone having a refractive index $n_d=1.41$ and a viscosity of 4 Pa s and with a loading of 220 wt % (i.e. 220 g phosphor in 100 g silicone, 69 wt % phosphor in the silicon) with respect to the silicone weight. The suspension was then dispensed into a 2.7×2.0 mm² lead frame LED package equipped with a 622 nm emitting LED die that emits a radiation power of 195 mW at 350 mA and room temperature.

Figure 21:
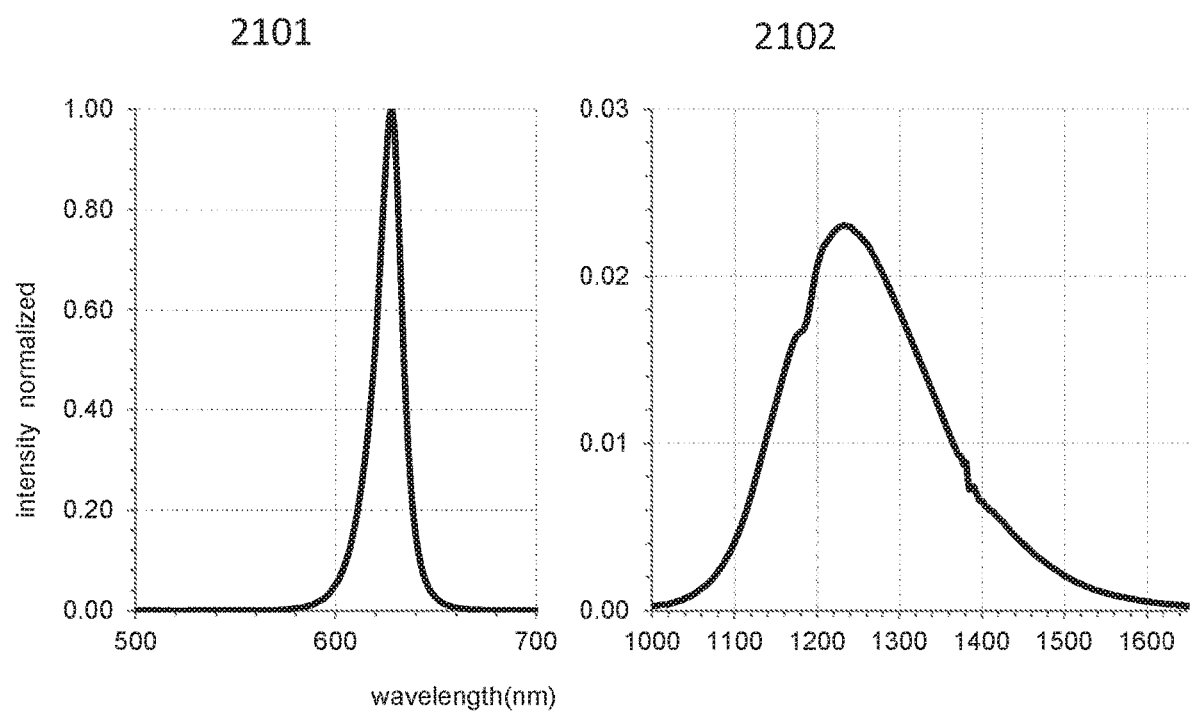
FIG. 21 shows the mission spectrum of the phosphor converted LED of Example 8 for the visible (left) and IR (right) spectral range.

FIG. 21 shows the emission spectrum of the phosphor converted LED of this Example 8 for the visible 2101 and IR 2102 spectral range. The phosphor converted LED shows the same emission band as shown in FIG. 16, except for a small dip in the emission profile at around 1190 nm due to absorption of the silicone encapsulant used. The total emitted IR radiation power in the 1000-1600 nm spectral range is 50-60 mW (power conversion red/IR=25-30% (FIG. 21).

9) Example of a Phosphor Converted LED with Blue Emitting InGaN Pump LED

Figure 22:
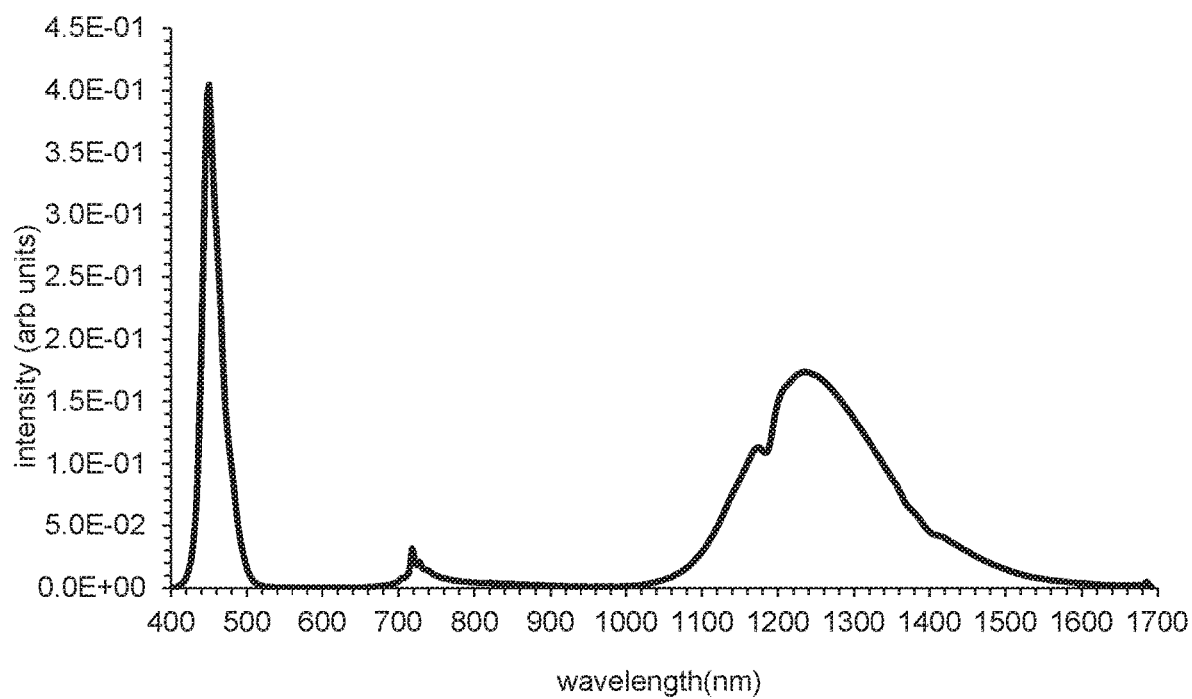
FIG. 22 shows the total emission spectrum of the pcLED of Example 9.

The $Li_{0.49}Sc_{0.05}Ga_{2.384}O_4:Ni_{0.013},Cr_{0.05}$ spinel type phosphor synthesized as described in Example 5 was mixed with a polydimethyl siloxane type silicone encapsulant (weight ratio phosphor/silicone=0.45) and dispensed into 2720 type leadframe LED packages of a size of 2.7 mm×2.0 mm×0.6 mm (L×W×H) equipped with 450 nm emitting InGaN dies (550 mW output power at 350 mA at 25° C. if filled with the same silicone as used for Example 8 above). FIG. 22 shows the total emission spectrum of the pcLED of this Example 9 for 350 mA drive current. In the spectral range of 1000-1700 nm, the LED shows an infrared output power of 171 mW.

10) Phosphor Converted LED with Blue Emitting InGaN Pump LED and Additional Orange-Red Emitting $(Ba_{0.4}Sr_{0.6})_{1.98}Si_5N_8:Eu_{0.02}$ Phosphor The $Li_{0.49}Sc_{0.05}Ga_{2.384}O_4:Ni_{0.013},Cr_{0.05}$ phosphor synthesized as described in Example 5 was mixed with $(Ba_{0.4}Sr_{0.6})_{1.98}Si_5N_8:Eu_{0.02}$ phosphor and with a polydimethyl siloxane type silicone encapsulant (weight ratio phosphor/silicone=0.45, weight ratio IR phosphor/orange-red phosphor=3) and dispensed into 2720 type leadframe LED packages of a size of 2.7 mm×2.0 mm×0.6 mm (L×W×H) equipped with 450 nm emitting InGaN dies (550 mW output power at 350 mA at 25° C. if filled with the same silicone as used for example 8 above).

Figure 23:
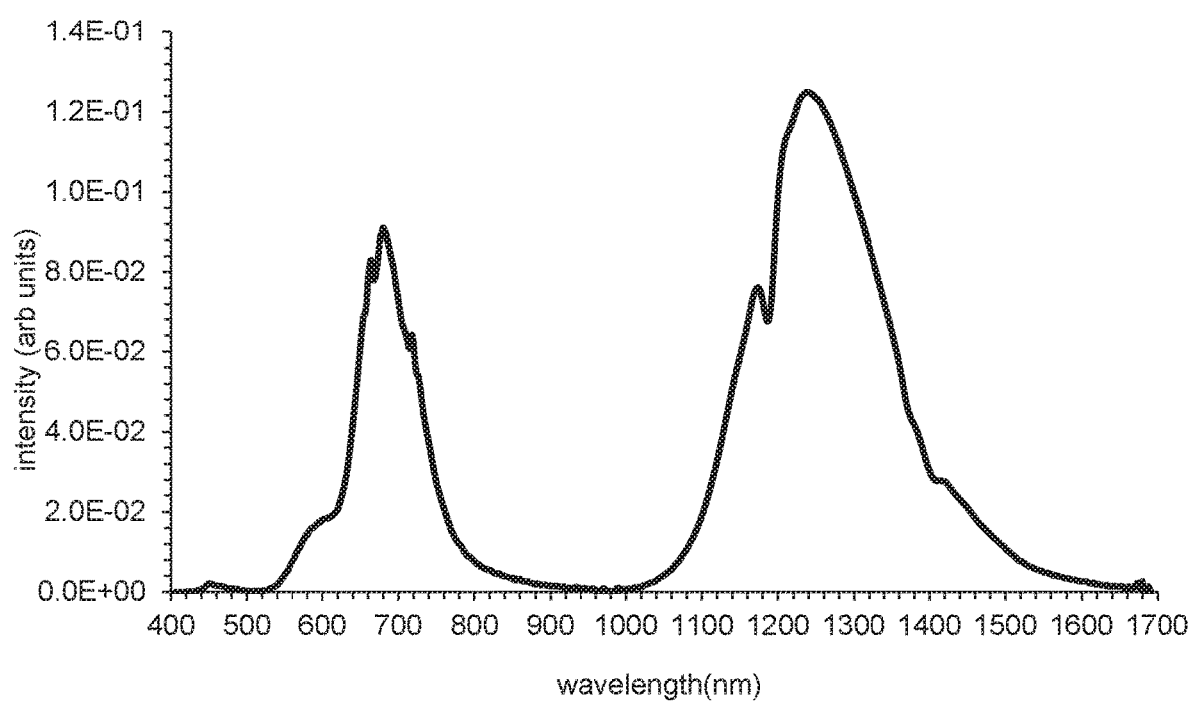
FIG. 23 shows the total emission spectrum of the pcLED of Example 10.

$(Ba_{0.4}Sr_{0.6})_{1.98}Si_5N_8:Eu_{0.02}$ phosphor was made by mixing $BaH_2$ (Materion, >99%), $SrH_2$ (Materion, >99%), $Eu2O3$ (Neo, >99.9%) and Si3N4 (UBE, >98%) under inert conditions and firing the mixture twice with milling in-between the firings under forming gas at 1680° C. The phosphor is then washed in diluted mineral acid, water and ethanol followed by ball milling. FIG. 23 shows the total emission spectrum of Example 10 for 350 mA drive current. In the spectral range 1000-1700 nm the LED shows an infrared output power of 139 mW.

This disclosure is illustrative and not limiting. Further modifications will be apparent to one skilled in the art in light of this disclosure and are intended to fall within the scope of the appended claims

The invention claimed is:

1. A wavelength converting structure comprising an SWIR phosphor material having emission wavelength in the range of 1000 to 1700 nm, the SWIR phosphor material including: $RET1-2pO3:Ni_p,Z_p$ where RE=La, Gd, Y, Lu, Yb, Nd, Tm, or Er, or mixtures thereof, T=Al, Ga, Sc, or In, or mixtures thereof, and Z=Ti, Hf, Zr, Si, Ge, or Sn, or mixtures thereof; $0<p\leq0.1$.

2. The wavelength converting structure of claim 1, wherein the SWIR phosphor comprises $YAl_{0.5}Ga_{0.49}O_3:Ni_{0.005},Ge_{0.005}$.

3. A device comprising wavelength converting structure of claim 1 and a light source, the light source configured to emit a first light, the wavelength converting structure disposed in a path of the first light, wherein the SWIR phosphor material absorbs the first light and emits a second light, the second light having a wavelength range of 1000 to 1700 nm.

4. The device of claim 3, wherein the light source comprises an AlInGaP LED.

5. The device of claim 3, wherein the wavelength converting structure further comprises a second phosphor material, wherein the second phosphor material absorbs the first light emitted by the light source and emits a third light, and the SWIR phosphor material absorbs the third light and emits a second light, the second light having a wavelength range of 1000 to 1700 nm.

6. The device of claim 5, wherein the second phosphor is a green to red emitting phosphor and the light source is a blue emitting LED.

7. The device of claim 6, wherein the second phosphor includes at least one of $(Sr,Ca)AlSiN_3:Eu$ and $(Ba,Sr,Ca)_2Si_{5-x}Al_xO_xN_{8-x}:Eu$.

8. The device of claim 7, wherein the second phosphor includes $Li_{0.5-0.5x}(Ga,Sc)_{2.5-0.5x-y}O_4:Ni_x,Cr_y$ (where $0\leq x\leq 1$, $0<y\leq 0.1$) and $(Ba,Sr)_2Si_5N_8:Eu$, and the light source is a blue light emitting InGaN LED.

9. The device of claim 7, wherein the second phosphor includes at least one of $LaMgGa_{11}O_{19}:Ni$, $MgO:Ni$, $MgF_2:Ni$, $Ga_2O_3:Ni,Ge$, and garnet type phosphors of composition $RE_2AEMg_2TV_3O_{12}:Ni$ (RE=Y, La, Lu, Gd, Nd, Yb, Tm, Er; AE=Ca, Sr; TV=Si, Ge.

10. A wavelength converting structure comprising an SWIR phosphor material having emission wavelength in the range of 1000 to 1700 nm, the SWIR phosphor material including:

$RE_3AA_{2-2q-s}TT_3O_{12}:Ni_q,Z_q,Cr_s$ where RE=La, Gd, Y, Lu, Yb, Nd, Tm, or Er, or mixtures thereof, AA=Ga, Sc, In, Al, or Lu, T=Al, or Ga, or mixtures thereof, Z=Ti, Hf, Zr, Si, Ge, or Sn, or mixtures thereof; $0<q\leq0.1$, $0<s\leq0.2$.

11. The wavelength converting structure of claim 10, wherein the SWIR phosphor comprises at least one of $Gd_3Ga_{3.82}AlO_{12}:Cr_{0.1},Ni_{0.04},Zr_{0.04}$ and $Gd_3Ga_{3.82}AlO_{12}:Ni_{0.04},Zr_{0.04}$.

12. A device comprising wavelength converting structure of claim 10 and a light source, the light source configured to emit a first light, the wavelength converting structure disposed in a path of the first light, wherein the SWIR phosphor material absorbs the first light and emits a second light, the second light having a wavelength range of 1000 to 1700 nm.

13. The device of claim 12, wherein the light source comprises an AlInGaP LED.

14. The device of claim 12, wherein the wavelength converting structure further comprises a second phosphor material, wherein the second phosphor material absorbs the first light emitted by the light source and emits a third light, and the SWIR phosphor material absorbs the third light and emits a second light, the second light having a wavelength range of 1000 to 1700 nm.

15. The device of claim 14, wherein the second phosphor is a green to red emitting phosphor and the light source is a blue emitting LED.

16. The device of claim 15, wherein the second phosphor includes at least one of $(Sr,Ca)AlSiN_3:Eu$ and $(Ba,Sr,Ca)_2Si_{5-x}Al_xO_xN_{8-x}:Eu$.

17. The device of claim 16, wherein the second phosphor includes $Li_{0.5-0.5x}(Ga,Sc)_{2.5-0.5x-y}O_4:Ni_x,Cr_y$ (where $0\leq x\leq1$, $0<y\leq0.1$) and $(Ba,Sr)_2Si_5N_8:Eu$, and the light source is a blue light emitting InGaN LED.

18. The device of claim 16, wherein the second phosphor includes at least one of $LaMgGa_{11}O_9:Ni$, $MgO:Ni$, $MgF_2:Ni$, $Ga_2O_3:Ni,Ge$, or garnets of composition $RE_2AEMg_2TV_3O_{12}:Ni$ (RE=Y, La, Lu, Gd, Nd, Yb, Tm, Er; AE=Ca, Sr; TV=Si, Ge).

19. A wavelength converting structure comprising an SWIR phosphor material having emission wavelength in the range of 1000 to 1700 nm, the SWIR phosphor material including at least one of a perovskite type phosphor doped with $Ni^{2+}$, a perovskite type phosphor doped with $Ni^{2+}$ and $Cr^{3+}$, and a garnet type phosphor doped with $Ni^{2+}$ and $Cr^{3+}$.

* * * * *

UNITED STATES PATENT AND TRADEMARK OFFICE
CERTIFICATE OF CORRECTION

PATENT NO. : 11,535,798 B2
APPLICATION NO. : 17/035337
DATED : December 27, 2022
INVENTOR(S) : Peter Josef Schmidt and Detlef Wiechert It is certified that error appears in the above-identified patent and that said Letters Patent is hereby corrected as shown below:

In the Claims

Column 14, Line 24: replace "RET1-2pO3:Nip,Zp" with -- $RET_{1-2p}O_3:Ni_p,Z_p$ --

Signed and Sealed this
Fourteenth Day of March, 2023

*Katherine Kelly Vidal*

Katherine Kelly Vidal
*Director of the United States Patent and Trademark Office*